(12) United States Patent
Prescher

(10) Patent No.: US 11,611,301 B2
(45) Date of Patent: Mar. 21, 2023

(54) POWER TOOL, MEASURING DEVICE AND METHOD FOR OPERATING A POWER TOOL

(71) Applicant: Metabowerke GmbH, Neurtingen (DE)

(72) Inventor: Benjamin Prescher, Munich (DE)

(73) Assignee: Metabowerke Gmb H, Neurtingen (DE)

( * ) Notice: Subject to any disclaimer, the term of this patent is extended or adjusted under 35 U.S.C. 154(b) by 175 days.

(21) Appl. No.: 17/123,383

(22) Filed: Dec. 16, 2020

(65) Prior Publication Data

US 2021/0184609 A1 Jun. 17, 2021

(30) Foreign Application Priority Data

Dec. 17, 2019 (DE) ...................... 10 2019 134 777.7

(51) Int. Cl.
| | |
|---|---|
| H02K 7/14 | (2006.01) |
| H02P 21/16 | (2016.01) |
| H02P 21/22 | (2016.01) |
| B25F 5/00 | (2006.01) |
| G01K 1/024 | (2021.01) |
| G01K 3/00 | (2006.01) |
| G01K 3/08 | (2006.01) |
| G01R 27/08 | (2006.01) |
| G01R 31/34 | (2020.01) |

(52) U.S. Cl.
CPC ................ *H02P 21/16* (2016.02); *B25F 5/00* (2013.01); *G01K 1/024* (2013.01); *G01K 3/005* (2013.01); *G01K 3/08* (2013.01); *G01R 27/08* (2013.01); *G01R 31/346* (2013.01); *H02P 21/22* (2016.02)

(58) Field of Classification Search
CPC ........... H02P 21/16; H02P 21/22; G05B 9/02; G01K 1/024; G01K 3/005; G01K 3/08; B25F 5/00; G01R 27/08; G01R 31/346
See application file for complete search history.

(56) References Cited

FOREIGN PATENT DOCUMENTS

| | | | |
|---|---|---|---|
| DE | 0414052 B1 | 6/1993 | |
| DE | 60223466 T2 | 9/2008 | |
| DE | 202019101146 U1 | 3/2019 | |
| DE | 102019211975 A1 * | 2/2021 | ................ B25F 5/00 |

* cited by examiner

*Primary Examiner* — Karen Masih
(74) *Attorney, Agent, or Firm* — Neugeboren O'Dowd PC

(57) ABSTRACT

The invention relates to a method for operating a power tool, according to which a measuring device determines a winding resistance ($R_S$) of a winding of an electric motor of the power tool. A test signal source applies a test signal ($i_p$) to the winding during operation of the electric motor, a measuring unit records at least one measured value ($U_d$, $i_d$) as a reaction of the winding to the test signal ($i_p$), and a control device determines the winding resistance ($R_S$) while taking into consideration the measured value ($U_d$, $i_d$).

17 Claims, 2 Drawing Sheets

POWER TOOL, MEASURING DEVICE AND METHOD FOR OPERATING A POWER TOOL

PRIORITY AND CROSS-REFERENCE TO RELATED APPLICATIONS

This application claims priority to German Patent Application No. 10 2019 134 777.7 filed Dec. 17, 2019, the entire contents of which are incorporated herein by reference for all proper purposes.

FIELD OF THE INVENTION

The present invention relates to a method and computer program for operating a power tool as well as a power tool itself. The invention also relates to a measuring device for determining a winding resistance of a winding of an electric motor of a power tool.

BACKGROUND

In the following, both handheld power tools such as drills, angle grinders or the like and appliances that do not move during operation, e.g. stationary or semi-stationary appliances such as bench saws of the like, are understood to be power tools. Power tools and methods for operating them are adequately known from the general prior art.

As is known, the temperature of a winding of an electric motor increases under load. In order to protect the motor from possible overheating and therefore damage to its electrical and mechanical components, it is known to determine the temperature of the electric motor or to at least estimate it.

For example, DE 602 23 466 T2 discloses a system for estimating a temperature of an electric machine, comprising a control device and a temperature sensor that is functionally connected to the control device and sends a temperature signal. The control device is lastly able to carry out a temperature estimating process in order to estimate the temperature of the electric machine.

However, the use of a temperature sensor increases the production costs of the power tool.

As a result of the temperature of a winding of the electric motor increasing, the winding resistance of the winding changes, as a result of which control parameters of the electric motor are, in turn, influenced. For optimum controller design, however, the knowledge of the actual winding resistance value is of significant importance.

In order to monitor the winding resistance on the basis of the actual temperature of the electric motor, it is known to calculate the winding resistance on the basis of the temperature recorded by means of the temperature sensor. The diversion via the temperature measurement can, however, lead to comparatively inaccurate results.

SUMMARY OF THE INVENTION

In view of the known prior art, an object of the present invention is to provide a method for operating a power tool, where the winding resistance of a winding of an electric motor can be determined in a preferably cost-effective manner and with a high degree of accuracy.

In accordance with one aspect of the invention, a method for operating a power tool determines a winding resistance ($R_S$) of a winding of an electric motor of the power tool. A test signal source applies a test signal ($i_p$) to the winding during operation of the electric motor, a measuring unit records at least one measured value ($u_d$, $i_d$) as a reaction of the winding to the test signal ($i_p$), and a control device determines the winding resistance ($R_S$) while taking into consideration the measured value ($u_d$, $i_d$).

Another aspect of the present invention is to provide an advantageous computer program product for carrying out a corresponding method for operating a power tool.

Lastly, a further aspect of the invention is to provide a measuring device, where a winding resistance of a winding of an electric motor can be determined in a preferably cost-effective manner and with a high degree of accuracy.

It is also an object of the invention to provide an improved power tool.

The claims and the features described in the following relate to further advantageous embodiments and variants of the invention.

BRIEF DESCRIPTION OF THE DRAWINGS

Embodiments of the invention will be described in the following in more detail on the basis of the drawings.

Each of the drawings show embodiments in which individual features of the present invention are shown in combination with one another. Features of one embodiment are also implementable separate from the other features of the same embodiment and can accordingly be readily combined by a person skilled in the art with features of other embodiments in order to form additional sensible combinations and sub-combinations.

Figure 1:
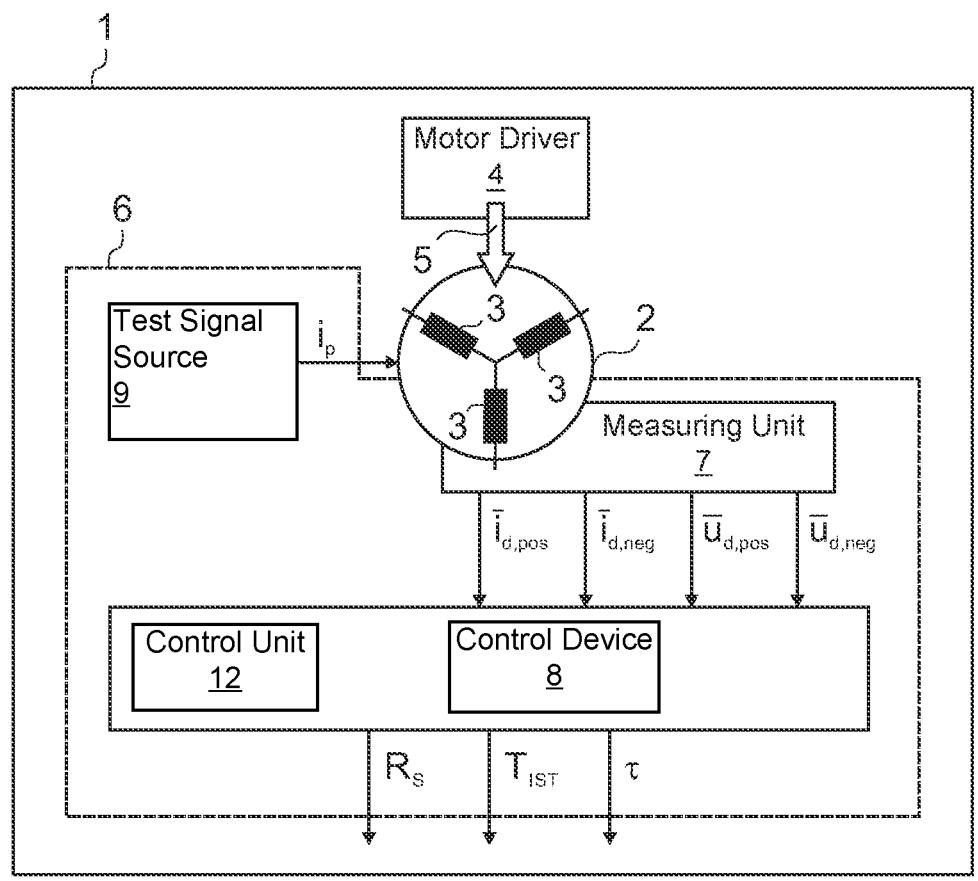
Figure 2:
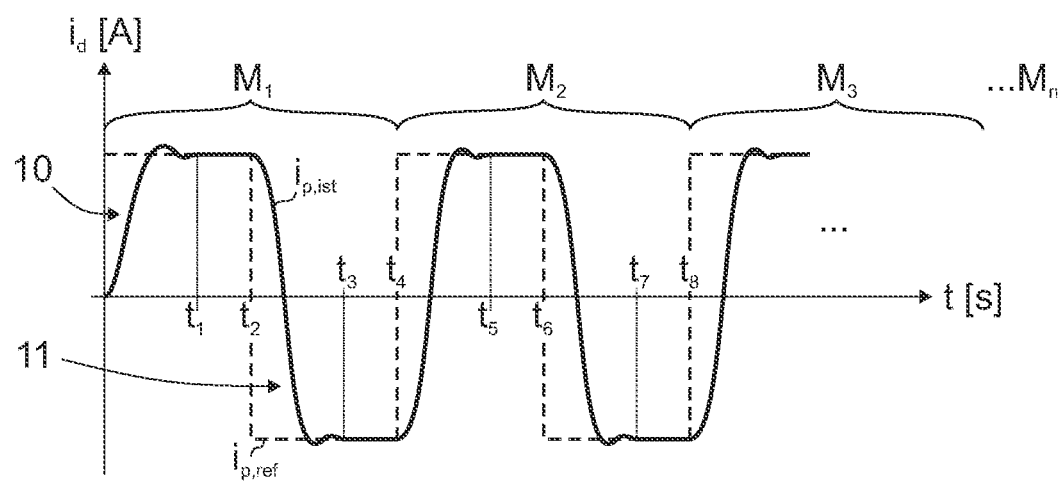

In the drawings, elements having the same function are provided with the same reference signs, in which:

FIG. 1 is a block diagram of a power tool according to the invention, comprising an electric motor and a measuring device;

FIG. 2 shows the example curve of a test signal; and

Figure 3:
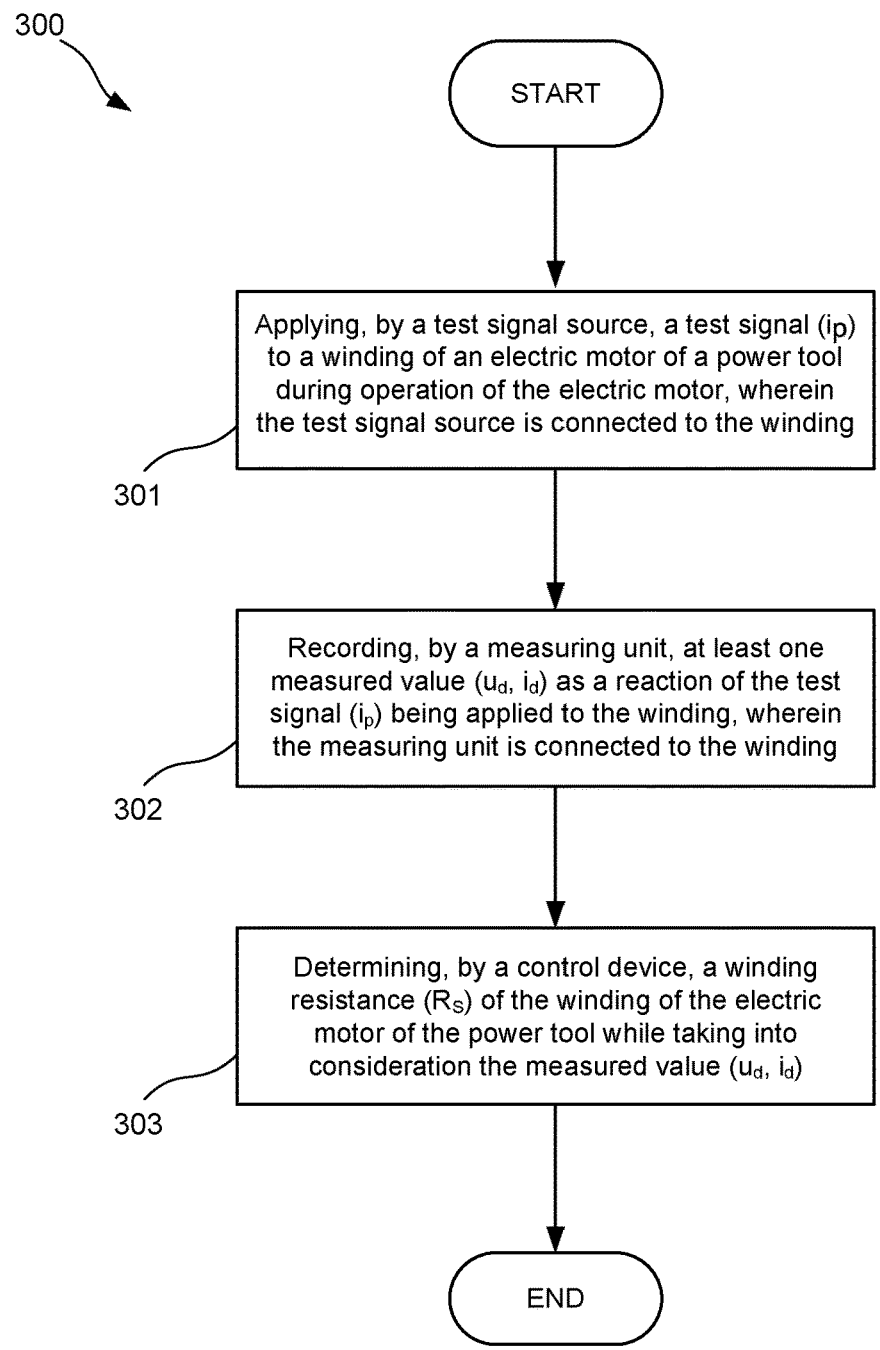

FIG. 3 shows a flowchart of a method for operating a power tool, according to various aspects of the disclosure.

DETAILED DESCRIPTION

A method for operating a power tool is provided, according to which a measuring device determines a winding resistance of a winding of an electric motor of the power tool.

According to one aspect of the invention, a test signal source applies a test signal to the winding during operation of the electric motor, a measuring unit recording at least one measured value as a reaction of the winding to the test signal. A control device lastly determines the winding resistance while taking into consideration the measured value.

The test signal is preferably a test current. By applying the test signal, in particular the test current, to the winding of the electric motor, the voltage decrease across the winding increases measurably. This increase can eventually be recorded by the measuring unit.

The control device preferably also takes the (known) test signal into account in addition to the measured value in order to determine the winding resistance. The control device can determine the winding resistance in particular by taking into consideration the amplitude of the test signal and the amplitude of the measured value.

According to the invention, there is no need for an additional external temperature sensor. As a result, the wiring and production effort, and as a result the production costs of the power tool, can be advantageously reduced.

Since according to the invention the winding resistance can be determined directly without a diversion via an actual temperature recorded first, the winding resistance can be recorded with a greater degree of accuracy and also quicker or more continuously.

In an advantageous development of the invention, the test signal source may generate the test signal having an alternating curve. The test signal can comprise a positive half wave and a negative half wave.

An alternating curve of the test signal can advantageously minimize common-mode interferences and inaccuracies of the motor parameters determined when the electric motor is switched off (for example inductances and machine flux).

The alternating test signal can preferably be generated having a frequency of from 1.0 Hz to 1.0 MHz, particularly preferably having a frequency of from 2.0 Hz to 2.0 kHz, more particularly preferably having a frequency of from 50.0 Hz to 1.0 kHz, for example 100.0 Hz. In principle, however, any frequencies may be provided.

The test signal source may preferably generate the test signal so as to have a rectangular curve. By using a rectangular test signal, in particular having a low frequency of only a few hertz, quasi-stationary states can be achieved for the measurement. As a result, the calculations and measurements required can be simplified.

In principle, however, a sinusoidal curve or any other curve of the test signal may also be provided.

In one embodiment of the invention, the test signal source may not continuously apply the test signal to the winding, but only during defined time periods during operation of the electric motor, for example.

The defined time periods in which the test signal is applied to the winding, preferably only extend over the shortest possible time frames, in particular only over time frames of a few milliseconds. As a result, due to the degree of thermal inertia of the machine, an increase in temperature caused by the test signal can be disregarded.

According to a development of the invention, the test signal source can modulate the test signal onto an operating signal applied to the winding.

The electric motor of the power tool can preferably be formed as a three-phase machine. For the open-loop or closed-loop control of the electric motor, field-oriented control (also known as "vector control") can preferably be provided.

Block commutation is preferably not provided for operating the electric motor. In principle, however, the invention can also be suitable for use in a power tool in which block commutation is provided in order to control the electric motor.

The test signal, in particular a test current, can be impressed into a stator winding of the electric motor in order to record the winding resistance of the stator winding.

According to a development of the invention, the test signal source can exclusively impress the test signal into the d-axis of a d-q coordinate system. This can be a rotor-fixed coordinate system of a permanent magnet synchronous motor.

As a result, undesirable alternating torque as a result of the influence of the q component can be ruled out.

In order to determine the winding resistance, the control device can evaluate the stator phase voltage equation in the d-q coordinate system:

$$u_d = R_s \cdot i_d + L_d \cdot \frac{di_d}{dt} - \omega_{el} \cdot L_q \cdot i_q,$$

with the phase voltage $u_d$, the phase currents $i_d$ and $i_q$, the winding resistance $R_S$, the stator inductances $L_d$ and $L_q$ and the angular speed $\omega_{el}$.

It may be provided that the measuring unit only records the at least one measured value after the transient oscillation of the test signal. Therefore, a certain amount of dead time can be waited for before the measurement is made, for example. Under stationary states, in particular when using a rectangular test current having a low frequency and when only measuring after the transient oscillation of the test signal, the above-mentioned equation can be simplified to:

$$u_d = R_S \cdot i_d - \omega_{el} \cdot L_q \cdot i_q$$

After the process of tuning the test signal, a plurality of measured current and voltage values can be recorded by the measuring unit. In order to record or digitally further process the measured values, an analogue-digital converter can be provided, for example.

In a development of the invention, the measuring unit can record at least one voltage measured value and at least one current measured value.

The measuring unit preferably carries out a phase voltage measurement and a phase current measurement.

In a development of the invention, the measuring unit can record at least one individual measured value or a measured value that is taken as an average for a plurality of individual measured values for each half wave of the alternating test signal, in particular an average voltage measured value ($\overline{u}_{d,pos}$ und $\overline{u}_{d,neg}$) and an average current measured value ($\overline{i}_{d,pos}$ und $\overline{i}_{d,neg}$) in each case. Preferably, by averaging a plurality of measured values for each half wave, an average test current can be determined (shown by way of example in the following for an interval in the time frame $t_1$ to $t_2$ for the positive half wave and for an interval in the time frame $t_3$ to $t_4$ for the negative half wave):

$$\overline{i}_{d,pos} = \frac{1}{n} \cdot \int_{t_1}^{t_2} i_d(t)dt, \; \overline{i}_{d,neg} = \frac{1}{n} \cdot \int_{t_3}^{t_4} i_d(t)dt.$$

The measured values can also be averaged by the control device.

In an advantageous development of the invention, the control device or the measuring unit can calculate a differential measured value from the individual measured values recorded for the particular half wave or average measured values, in particular a differential voltage measured value ($\overline{u}_{d,pos} - \overline{u}_{d,neg}$) and a differential current measured value ($\overline{i}_{d/q,pos} - \overline{i}_{d/q,neg}$), in order to determine the winding resistance.

For example, after measuring two half waves of the alternating test signal, an evaluation of the measured data can be provided (an evaluation of two successive half waves is also referred to as the "measuring interval" in the following). The winding resistance of the measuring interval n can lastly be determined by the control device or by the measuring unit from the difference in the resultant phase voltage equation for the positive and for the negative half wave and assuming a constant rotational speed in the measuring interval:

$$R_{S,n} = \frac{1}{\overline{i}_{d,pos} - \overline{i}_{d,neg}} \cdot [\overline{u}_{d,pos} - \overline{u}_{d,neg} + \omega_{el} \cdot L_q \cdot (\overline{i}_{q,pos} - \overline{i}_{q,neg})]$$

The measurement can preferably lastly extend over a plurality of measuring intervals. After the individual winding resistances $R_{S,n}$ of the plurality of measuring intervals n have been filtered through a PT1 filter or low-pass filter/an average has been formed therefrom, the final result for the winding resistance $R_S$ can be output.

In a development of the invention, the control device can calculate one or more control parameters on the basis of the winding resistance, preferably a time constant of the stator winding.

Control of the electric motor of the power tool can therefore be improved and be more efficient.

The winding resistance $R_S$ can particularly preferably be used to determine the electric time constant of the stator winding ($\tau=L/R$), which is advantageous for control technology methods, such as calculating current control parameters.

In an advantageous development of the invention, the control device can calculate an actual temperature of the electric motor on the basis of the winding resistance.

With the knowledge of the winding material used and the resistance thereof at a defined temperature, conclusions can be drawn about the winding temperature according to the winding resistance determined according to the invention. In this case, the winding resistance is approximately proportional to the temperature and can be described by transposing the following equation:

$$R_S = R_{S0} \cdot [1 + \alpha \cdot (T_{IST} - T_0)],$$

with the known winding resistance at the temperature $T_0$, the actual temperature $T_{IST}$ to be determined and the material-dependent temperature coefficient $\alpha$ in $1/°$ C.

An indirect determination of the temperature of the motor winding can therefore advantageously be made during operation of the power tool or electric motor.

By calculating the actual temperature, the temperature of the electric motor or the power tool can advantageously be monitored without the need for an additional temperature sensor.

In an advantageous development of the invention, the control device can record a temperature difference between the actual temperature and a nominal temperature to be expected.

If, for example, the measured actual temperature is clearly above the nominal temperature to be expected, an error condition can be assumed, in particular contamination of the power tool or any other type of obstruction to the cool airflow. Lastly, suitable countermeasures can optionally be taken. Therefore, the operating life of the power tool can advantageously be increased.

In an advantageous development of the invention, a message can be output to a user of the power tool on the basis of the temperature difference.

The user of the power tool can therefore be informed about the possibly problematic state of the power tool, for example it being dirty or dusty, so that they can take suitable countermeasures to end the state.

For example, an optical message can be output. This makes it possible to pass on the critical state of the power tool to the user thereof in a very simple manner.

Alternatively or in addition, an acoustic message can be output. In this way, too, the user can be informed of the problematic state of the power tool.

Another possibility consists in a message being output to a mobile end apparatus by through a wireless interface. Such a mobile end apparatus can forward the message to the user in a different manner.

In a development of the invention, the power tool can be switched off if the temperature difference exceeds a predefined threshold value.

Damage to the power tool can in particular advantageously also be prevented by implementing this measure.

The nominal temperature to be expected can preferably be calculated by a mathematical model from the operating parameters and/or constants of the electric motor. Such a mathematical model represents a simple option for calculating the temperature to be expected as a result of the operation of the power tool.

It may be particularly advantageous for the operating parameters and/or constants of the electric motor to include a rotational speed, a current strength and/or an electrical resistance. These operating parameters of the electric motor ensure a very high degree of accuracy when calculating the nominal temperature to be expected.

It should be mentioned that the continuous modulation of the test signal during operation of the electric motor is not absolutely essential. Instead, the winding resistance value can be updated by the user or an algorithm at specific times.

The method according to the invention may be used for determining each winding of an electric motor comprising a plurality of windings. Therefore, according to the invention, the winding resistance can be determined for each of the windings. However, it may optionally already be enough to only determine the winding resistance of one of the windings of the electric motor, since it can generally be assumed that the current temperature and therefore also the winding resistances of all the windings have a similar curve.

The invention also relates to a computer program product, which comprises program code for carrying out a method according to the embodiments mentioned above and in the following when the program is executed on a control unit of a power tool.

The control unit can correspond to the control device. The control unit can, however, also be independent of the control device.

The control device or the control unit can be formed as a microprocessor. Instead of a microprocessor, any other device for implementing the control device or control unit can also be provided, for example one or more arrangements of discrete electrical components or on a printed circuit board, an application-specific integrated circuit (ASIC) or any other programmable circuit, for example also a Field Programmable Gate Array (FPGA) and/or a programmable logical arrangement (PLA).

The invention also relates to a measuring device for determining a winding resistance of a winding of an electric motor of a power tool.

The measuring device comprises a measuring unit and a control device. The measuring device also comprises a test signal source, which is connected to the winding in order to apply a test signal generated by the test signal source to the winding. The measuring unit is connected to the winding in order to record at least one measured value as a reaction to the test signal being applied to the winding. The control device is designed to determine the winding resistance while taking into consideration the test signal and the measured value.

By means of the measuring device according to the invention, the ohmic stator resistance of the electric motor or a stator winding of the electric motor can advantageously be determined during operation of the electric motor.

When the test signal is applied to the winding, the electric motor can preferably be in a rotating state and optionally also in a state in which it is placed under strain by torques.

Lastly, the winding resistance can allow conclusions to be drawn about the actual temperature of the windings or of the electric motor and/or can be advantageously used to determine parameters for controlling the current.

In particular, highly dynamic electric motors often comprise just very small winding resistances, for example in the milliohm range. The change in the winding resistance caused by the temperature can lastly be comparatively large. A doubling of the winding resistance caused by the temperature is not unusual either, and therefore the determination of the winding resistance according to the invention can be particularly advantageously suitable for use with highly dynamic electric motors or for use with electric motors having low winding resistances.

The invention lastly also relates to a power tool comprising an electric motor and a measuring device according to the embodiments mentioned above and in the following.

Features that have been described in connection with the method according to the invention are of course also advantageously implementable for the computer program product, the measuring device and the power tool—and vice versa. Furthermore, advantages that have already been mentioned in connection with the method according to the invention are also understood as relating to the computer program product, the measuring device and the power tool—and vice versa.

It should also be pointed out that terms such as "comprising," "having" or "with" do not exclude any other features or steps. Furthermore, terms such as "a" or "the," which refer to a single step or feature, do not exclude a plurality of features or steps—and vice versa.

The features introduced by the terms "comprising," "having" or "with" can also be given as an exhaustive list. Accordingly, one or more lists of features can be deemed to be exhaustive within the context of the invention, for example when viewed for each claim in each case.

It should also be emphasized that the values and parameters described in the present case include deviations or variations of ±10% or less, preferably ±5% or less, more preferably ±1% or less, and more particularly preferably ±0.1% or less of the value or parameter mentioned, provided that these deviations are not excluded when implementing the invention in practice. Where ranges are given by initial and final values, these also comprise all those values and fractions that are included in the range mentioned, in particular the initial and final values and a particular mean value.

Turning now to the drawings, FIG. 1 shows a block diagram of a power tool 1, which is not shown in more detail. The power tool 1 comprises an electric motor 2, which is preferably formed as a three-phase machine. The electric motor 2 comprises three phases or three windings 3, which are shown in a simplified manner in FIG. 1. A motor driver 4 is able to apply an operating signal 5 to the electric motor 2 or the windings 3 thereof. Vector control is preferably provided for operating the electric motor 2.

The power tool 1 also comprises a measuring device 6. The measuring device 6 is shown as an arrangement depicted by a dashed line inside the power tool 1 in FIG. 1. The measuring device 6 is designed to determine a winding resistance $R_S$ of a winding 3 of the electric motor 2. In principle, the winding resistances $R_S$ of each of the windings 3 or even just one winding resistance $R_S$ of a single winding 3 can be determined. The measuring device 6 comprises a measuring unit 7, a control device 8 and a test signal source 9.

The test signal source 9 is connected to the winding 3 (or windings 3) in order to apply a test signal $i_p$ generated by the test signal source 9 to the winding 3. The test signal $i_p$ is preferably a test current, the curve of which is shown in FIG. 2. The test signal $i_p$ comprises an alternating curve. In the ideal case, the test signal $i_p$ follows a rectangular curve (cf. the illustration depicted by a dashed line $i_{p,ref}$). The test signal $i_p$ is preferably modulated onto the operating signal 5 applied to the winding 3 during operation of the electric motor 2. In order to exclude undesirable alternating torque, the test signal $i_p$ is preferably only fed into the d-axis of a d-q coordinate system of a permanent magnetic synchronous motor.

The measuring unit 7 is connected to the winding 3 in order to record at least one measured value as a reaction to the test signal $i_p$ being applied to the winding 3. The measuring unit 7 preferably records at least one voltage measured value $u_d$ and at least one current measured value $i_d$. As a result, the stator phase voltage equation in the d-q coordinate system can lastly be evaluated.

In order to simplify the stator phase voltage equation, quasi-stationary states can preferably be assumed, in which respect the measuring unit 7 only carries out the measurement after the transient oscillation of the test signal $i_p$. FIG. 2 also shows the actual value $i_{p,ist}$ of the test signal $i_p$ in addition to the reference value $i_{p,ref}$. The measuring unit 7 preferably firstly carries out the measurements between the transiently oscillated time points $t_1$ and $t_2$ (for the positive half wave 10) and between the transiently oscillated time points $t_3$ and $t_0$ (for the negative half wave 11). The measuring unit 7 is able to record a measured value that is an average of a plurality of individual measured values $i_d$, $u_d$ for each half wave 10, 11 of the alternating test signal $i_p$. In this way, an average voltage measured value $\bar{u}_{d,pos}$, $\bar{u}_{d,neg}$ and an average current measured value $\bar{\iota}_{d,pos}$, $\bar{\iota}_{d,neg}$ can be established for each half wave 10, 11 of the test signal $i_p$. The average measured values $\bar{u}_{d,pos}$, $\bar{u}_{d,neg}$, $\bar{\iota}_{d,pos}$, $\bar{\iota}_{d,neg}$ can lastly be transmitted to the control device 8.

The control device 8 is designed to determine the winding resistance $R_S$ while taking into consideration the (average) measured values $\bar{u}_{d,pos}$, $\bar{u}_{d,neg}$, $\bar{\iota}_{d,pos}$, $\bar{\iota}_{d,neg}$ from the measuring unit 7. For this, the control device 8 can calculate a differential measured value from the average measured values $\bar{u}_{d,pos}$, $\bar{u}_{d,neg}$, $\bar{\iota}_{d,pos}$, $\bar{\iota}_{d,neg}$ recorded for the particular half wave 10, 11. From the average voltage measured values $\bar{u}_{d,pos}$, $\bar{u}_{d,neg}$ and the average current measured values $\bar{\iota}_{d,pos}$, $\bar{\iota}_{d,neg}$, the control device 8 therefore calculates a differential voltage measured value $(\bar{u}_{d,pos} - \bar{u}_{d,neg})$ and respective differential current measured values $(\bar{\iota}_{d,pos} - \bar{\iota}_{d,neg})$ and $(\bar{\iota}_{q,pos} - \bar{\iota}_{q,neg})$. As a result, the winding resistance $R_{S,n}$ of the corresponding measuring interval $M_{1 \ldots n}$ can ultimately be calculated by taking into consideration the stator phase voltage equation for stationary states.

A plurality of measuring intervals $M_{1 \ldots n}$ (cf. FIG. 2) are preferably evaluated and the particular result averaged in order to record the final winding resistance $R_S$ even more accurately.

The control device 8 can also be designed to calculate one or more control parameters on the basis of the winding resistance $R_S$, preferably a time constant τ of the winding 3.

In addition, the control device 8 can be designed to calculate an actual temperature $T_{IST}$ of the electric motor 2 on the basis of the winding resistance $R_S$. The control device 8 can lastly optionally also record a temperature difference between the actual temperature $T_{IST}$ and a nominal temperature to be expected. As a result, it is possible, for example, to determine whether the actual temperature $T_{IST}$ in the current operating state of the power tool 1 corresponds to the nominal temperature to be expected. It may sometimes occur that ventilation slots, for example, in the power tool 1 are blocked by dust or dirt and the actual temperature $T_{IST}$ of the power tool 1 increases disproportionately. On the basis of the temperature difference, a message can be output to a user of the power tool 1, for example, for example a notification to clean the power tool 1. The power tool 1 can optionally also be switched off if the temperature difference exceeds a predefined threshold value.

A corresponding method for operating a power tool 1, according to which the measuring device 6 determines the winding resistance $R_S$ of the winding 3 of the electric motor 2 of the power tool 1, can preferably be carried out as a computer program product, which comprises program code on a control unit 12 of the power tool 1.

The control unit 12 and the control device 8 can be identical, but optionally also independent of one another.

In principle, it should be mentioned that the measuring unit 7, the test signal source 9 and the control device 8 do not necessarily have to represent independent components or assemblies, but can also be present in any combinations. For example, method features, in particular relating to the evaluation of measured values, which have been described within the context of the measuring unit 7, can alternatively also be implemented by the control device 8—and vice versa.

FIG. 3 illustrates a flowchart of a method 300 for operating a power tool by determining a winding resistance ($R_s$) of a winding of an electric motor of the power tool, according to various aspects of the disclosure. The power tool implements one or more aspects of the power tool 1 described in relation to FIG. 1. For instance, the power tool 1 comprises the electric motor 2, windings 3, motor driver 4, measuring device 6, test signal source 9, measuring unit 7, control 8, and control unit 12, which may be similar or substantially similar to the ones described above in relation to FIGS. 1 and/or 2. In some cases, the electric motor 2 is formed as a three-phase machine and comprises three phases or three windings 3.

At step 301, the method 300 comprises applying, by a test signal source, a test signal ($i_p$) to the winding of the electric motor of the power tool during operation of the electric motor. In some cases, the test signal source is connected to the winding.

At step 302, the method 300 comprises recording, by a measuring unit, at least one measured value ($u_d$, $i_d$) as a reaction of the test signal ($i_p$) being applied to the winding. In some cases, the measuring unit is connected to the winding. In some cases, the measuring unit 7 records at least one voltage measured value, $u_d$, and at least one current measured value, $i_d$.

At step 303, the method comprises determining, by a control device, a winding resistance ($R_S$) of the winding of the electric motor of the power tool while taking into consideration the measured value ($u_d$, $i_d$).

The invention claimed is:

1. A method for operating a power tool, according to which a measuring device determines a winding resistance ($R_s$) of a winding of an electric motor of the power tool, the method comprising:
   applying, by a test signal source, a test signal ($i_p$) to the winding during operation of the electric motor, wherein the test signal source is connected to the winding;
   recording, by a measuring unit, at least one measured value ($u_d$, $i_d$) as a reaction of the test signal ($i_p$) being applied to the winding, wherein the measuring unit is connected to the winding; and
   determining, by a control device, the winding resistance ($R_S$) of the winding of the electric motor of the power tool while taking into consideration the measured value ($u_d$, $i_d$).

2. The method according to claim 1, wherein the test signal source generates the test signal ($i_p$) having an alternating curve.

3. The method according to claim 1, wherein the test signal source modulates the test signal ($i_p$) onto an operating signal applied to the winding.

4. The method according to claim 1, wherein the test signal source feeds the test signal ($i_p$) into the d-axis of a d-q coordinate system.

5. The method according to claim 1, wherein the measuring unit records at least one voltage measured value ($u_d$) and at least one current measured value ($i_d$).

6. The method according to claim 2, wherein the measuring unit records at least one individual measured value ($u_d$, $i_d$) or a measured value that is taken as an average for a plurality of individual measured values ($u_d$, $i_d$), for each half wave of the alternating test signal ($i_p$).

7. The method according to claim 6, further comprising: measuring an average voltage measured value ($\bar{u}_{d,pos}$, $\bar{u}_{d,neg}$) and an average current measured value ($\bar{i}_{d,pos}$, $\bar{i}_{d,neg}$) for each half wave of the alternating test signal ($i_p$).

8. The method according to claim 6, wherein the control device calculates a differential measured value from the individual measured values ($u_d$, $i_d$) recorded for the particular half wave or average measured values ($\bar{u}_{d,pos}$, $\bar{u}_{d,neg}$, $\bar{i}_{d,pos}$, $\bar{i}_{d,neg}$), in order to determine the winding resistance ($R_S$).

9. The method according to claim 8, wherein the control device calculates a differential voltage measured value and a differential current measured value, in order to determine the winding resistance ($R_S$).

10. The method according to claim 1, wherein the control device calculates one or more control parameters on the basis of the winding resistance ($R_S$), including at least a time constant (t) of the winding.

11. The method according to claim 1, wherein the control device calculates an actual temperature ($T_{IST}$) for the electric motor on the basis of the winding resistance ($R_S$).

12. The method according to claim 11, wherein the control device records a temperature difference between the actual temperature ($T_{IST}$) and a nominal temperature to be expected.

13. The method according to claim 12, further comprising:
    outputting a message to a user of the power tool on the basis of the temperature difference.

14. The method according to claim 12, wherein the power tool is switched off if the temperature difference exceeds a predefined threshold value.

15. A non-transitory computer program product executed on a control unit of a power tool and configured to perform a method for operating the power tool by determining a winding resistance ($R_s$) of a winding of an electric motor of the power tool, the method comprising:
    applying, by a test signal source, a test signal ($i_p$) to the winding during operation of the electric motor, wherein the test signal source is connected to the winding;
    recording, by a measuring unit, at least one measured value ($u_d$, $i_d$) as a reaction of the test signal ($i_p$) being applied to the winding, wherein the measuring unit is connected to the winding; and determining, by a control device, the winding resistance ($R_S$) of the winding of the electric motor of the power tool while taking into consideration the measured value ($u_d$, $i_d$).

16. A measuring device for determining a winding resistance ($R_S$) of a winding of an electric motor of a power tool, comprising a measuring unit and a control device,
characterized in that a test signal source is provided and is connected to the winding in order to apply a test signal ($i_p$) generated by the test signal source to the winding, the measuring unit being connected to the winding in order to record at least one measured value ($u_d$, $i_d$) as a reaction to the test signal ($i_p$) being applied to the winding and the control device being designed to determine the winding resistance ($R_S$) while taking into consideration the measured value ($u_d$, $i_d$).

17. A power tool, comprising an electric motor and a measuring device, wherein the measuring device determines a winding resistance ($R_S$) of a winding of the electric motor and the measuring device comprises:
a measuring unit and a control device, characterized in that a test signal source is provided and is connected to the winding in order to apply a test signal ($i_p$) generated by the test signal source to the winding, the measuring unit being connected to the winding in order to record at least one measured value ($u_d$, $i_d$) as a reaction to the test signal ($i_p$) being applied to the winding and the control device being designed to determine the winding resistance ($R_S$) while taking into consideration the measured value ($u_d$, $i_d$).

* * * * *

UNITED STATES PATENT AND TRADEMARK OFFICE
CERTIFICATE OF CORRECTION

| | | |
|---|---|---|
| PATENT NO. | : 11,611,301 B2 | Page 1 of 1 |
| APPLICATION NO. | : 17/123383 | |
| DATED | : March 21, 2023 | |
| INVENTOR(S) | : Benjamin Prescher | |

It is certified that error appears in the above-identified patent and that said Letters Patent is hereby corrected as shown below:

On the Title Page

(71) Applicant should read: Metabowerke GmbH, Nuertingen (DE)

(73) Assignee should read: Metabowerke GmbH, Nuertingen (DE)

Signed and Sealed this
Eleventh Day of July, 2023

Katherine Kelly Vidal
*Director of the United States Patent and Trademark Office*